United States Patent
Okada et al.

(10) Patent No.: US 9,777,797 B2
(45) Date of Patent: Oct. 3, 2017

(54) ACTUATOR

(71) Applicant: ASMO CO., LTD., Kosai, Shizuoka-pref. (JP)

(72) Inventors: Shinichi Okada, Toyohashi (JP); Yasuhide Ito, Toyokawa (JP); Kohei Shibata, Kosai (JP); Takafumi Negi, Hamamatsu (JP)

(73) Assignee: ASMO CO., LTD., Kosai (JP)

( * ) Notice: Subject to any disclaimer, the term of this patent is extended or adjusted under 35 U.S.C. 154(b) by 31 days.

(21) Appl. No.: 14/953,019

(22) Filed: Nov. 27, 2015

(65) Prior Publication Data

US 2016/0153527 A1 Jun. 2, 2016

(30) Foreign Application Priority Data

| Dec. 1, 2014 | (JP) | 2014-243338 |
| Dec. 1, 2014 | (JP) | 2014-243339 |
| Nov. 5, 2015 | (JP) | 2015-217713 |

(51) Int. Cl.
*F16H 1/22* (2006.01)
*F16H 1/14* (2006.01)
(Continued)

(52) U.S. Cl.
CPC .......... *F16H 1/145* (2013.01); *F16H 1/225* (2013.01); *H02K 7/1163* (2013.01); *F16C 19/06* (2013.01);
(Continued)

(58) Field of Classification Search
CPC .......... F16H 1/222; F16H 1/145; F16H 1/225; F16C 35/067; H02K 7/1163; H02K 7/1166; G01B 7/14
(Continued)

(56) References Cited

U.S. PATENT DOCUMENTS 4,282,767 A * 8/1981 Guichard ................ F16H 1/225
                                                        74/410
4,633,149 A * 12/1986 Welterlin ................. H02K 5/08
                                                        310/68 R
(Continued)

FOREIGN PATENT DOCUMENTS

DE         10161754 C1 * 8/2003 ............. F16H 1/222
DE     102012222949 A1 * 6/2014 ............ B60T 13/746
(Continued)

OTHER PUBLICATIONS

Machine translation of DE 102012222949.*

*Primary Examiner* — William C Joyce
*Assistant Examiner* — Randell J Krug
(74) *Attorney, Agent, or Firm* — SOLARIS Intellectual Property Group, PLLC

(57) ABSTRACT

An actuator comprises a motor including a rotation shaft; an output shaft disposed coaxially to the rotation shaft; a rotation shaft side gear rotatable as a unit with the rotation shaft; an output shaft side gear rotatable as a unit with the output shaft; an intermediate gear configuration body that includes a first intermediate gear and a second intermediate gear and that meshes with the rotation shaft side gear and the output shaft side gear; a first bearing supporting an end portion of the intermediate gear configuration body at a side of the first intermediate gear; and a second bearing supporting another end portion of the intermediate gear configuration body at a side of the second intermediate gear; wherein the second intermediate gear is rotatable as a unit with the first intermediate gear and is disposed further to a radial direction outside of the motor than the first intermediate gear.

12 Claims, 12 Drawing Sheets

(51) Int. Cl.
- *G01R 33/07* (2006.01)
- *H02K 7/116* (2006.01)
- *G01B 7/14* (2006.01)
- *F16C 35/067* (2006.01)
- *F16C 19/06* (2006.01)
- *F16C 19/54* (2006.01)

(52) U.S. Cl.
CPC .......... *F16C 19/543* (2013.01); *F16C 35/067* (2013.01); *F16C 2361/61* (2013.01); *F16H 1/222* (2013.01); *G01B 7/14* (2013.01); *G01R 33/07* (2013.01); *H02K 7/1166* (2013.01)

(58) Field of Classification Search
USPC ................. 74/416, 410, 424; 310/49.23; 318/400.38
See application file for complete search history.

(56) References Cited

U.S. PATENT DOCUMENTS

| | | | |
|---|---|---|---|
| 4,758,751 A * | 7/1988 | Hosoya | H02K 29/08 310/156.26 |
| 5,112,284 A * | 5/1992 | Dye | F16H 48/29 475/227 |
| 6,770,006 B2 * | 8/2004 | Abrahamsen | A47C 20/041 475/343 |
| 6,944,906 B2 | 9/2005 | Moein et al. | |
| 9,400,040 B2 * | 7/2016 | Tseng | F16H 25/2056 |
| 2006/0169061 A1 * | 8/2006 | Seffernick | H02K 29/08 73/862.331 |
| 2009/0010584 A1 * | 1/2009 | Jang | F16C 19/10 384/492 |
| 2011/0061574 A1 * | 3/2011 | Klinke | A47B 9/04 108/147.19 |
| 2011/0232405 A1 * | 9/2011 | Morin | F16H 55/26 74/417 |
| 2012/0133249 A1 * | 5/2012 | Konkola | G02B 26/105 310/68 B |
| 2014/0035563 A1 * | 2/2014 | Tan | B29C 45/281 324/207.2 |
| 2014/0292129 A1 * | 10/2014 | Nakatake | H02K 1/146 310/90 |

FOREIGN PATENT DOCUMENTS

| | | | | |
|---|---|---|---|---|
| IT | WO 9004117 A1 * | 4/1990 | ............... | F16H 1/16 |
| JP | H7-54934 A | 2/1995 | | |
| JP | 2003-529731 A | 10/2003 | | |
| JP | 2014-42431 A | 3/2014 | | |
| KR | WO 2014077449 A1 * | 5/2014 | ............ | F16H 1/225 |
| SE | DE 102011005240 A1 * | 9/2012 | .......... | F03D 11/0008 |
| WO | 9004117 A | 4/1990 | | |

* cited by examiner

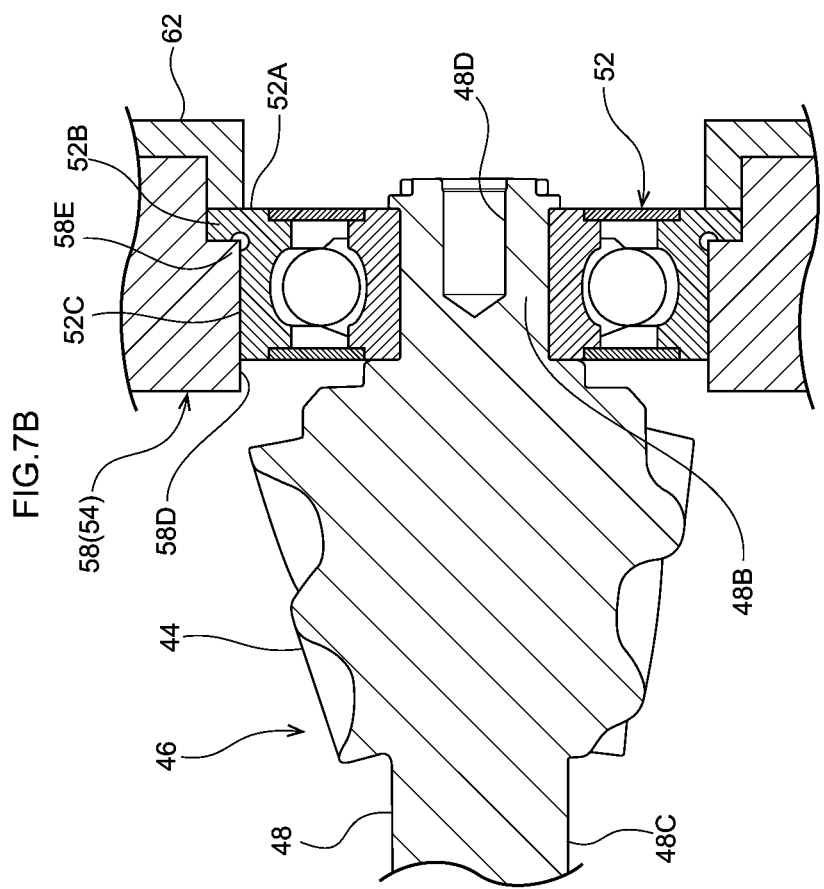

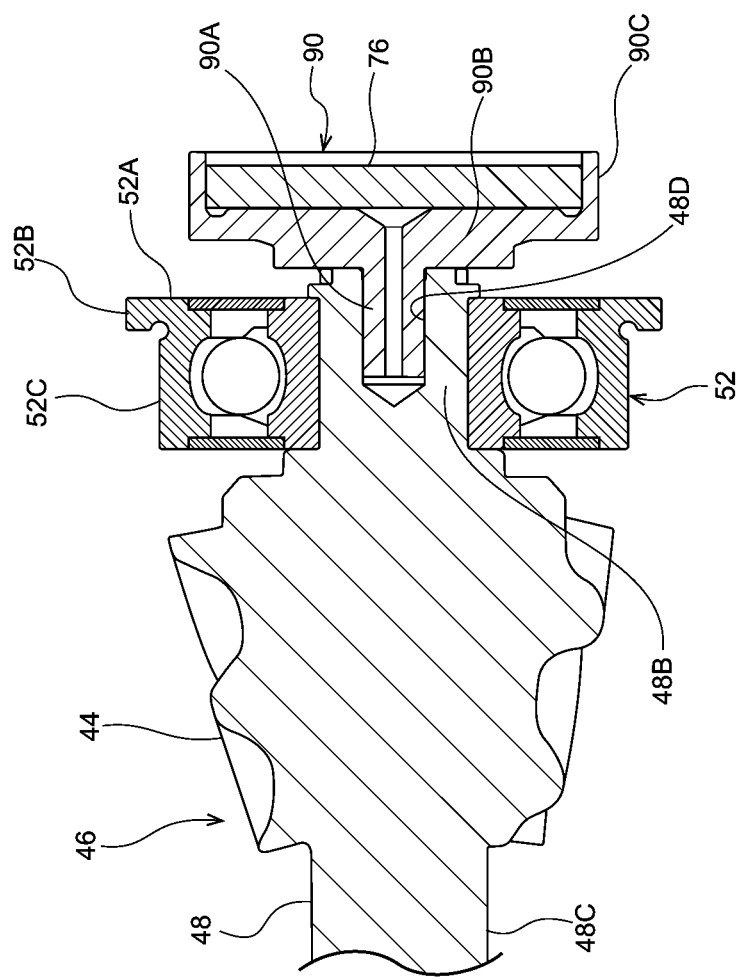

ACTUATOR

CROSS-REFERENCE TO RELATED APPLICATIONS

This application claims priority under 35 USC 119 from Japanese Patent Applications No. 2014-243338 filed Dec. 1, 2014, No. 2014-243339 filed Dec. 1, 2014, and No. 2015-217713 filed Nov. 5, 2015, the disclosures of which are incorporated by reference herein in their entireties.

BACKGROUND

Technical Field

The present invention relates to an actuator.

Related Art

Japanese National-Phase Publication No. 2003-529731 describes an actuator provided with a speed reduction mechanism, and this actuator includes a DC motor and a speed reduction mechanism that transmits to an output shaft with a rotation speed about a rotation shaft of the DC motor reduced by a specific speed reduction ratio. Moreover, the speed reduction mechanism is configured including a worm provided on the rotation shaft of the DC motor, a worm gear wheel that meshes with the worm, a beveled gear wheel that is provided coaxial to the worm gear wheel and that is configured rotatable as a unit with the worm gear wheel, and a crown gear wheel that is provided rotatable as a unit with the output shaft and that meshes with the beveled gear wheel.

However, in the actuator described above, the worm gear wheel and the beveled gear wheel are cantilever-supported by a shaft extending from a bracket. It is therefore conceivable that countermeasures such as increases in rigidity of the shaft extending from the bracket will be necessitated in order to suppress axial displacement between the worm gear wheel and the beveled gear wheel during operation of the actuator. This would increase the size of the speed reduction mechanism and increase the frame size of the actuators provided with this speed reduction mechanism.

Moreover, in order to detect a rotation speed and rotation angle of the output shaft of the actuator described above, it is conceivable that a sensor magnet described in Japanese Patent Application Laid-Open (JP-A) No. 2014-42431 might be attached to one end of the output shaft. However, in such cases, it is necessary to provide a circuit board mounted with an element for detecting the magnetic field of the sensor magnet at one axial direction side of the output shaft, increasing the size of the actuator in its axial direction.

In consideration of the above particulars, preferred embodiments provide an actuator capable of suppressing an increase in frame size.

SUMMARY

An actuator of a first aspect of the disclosures includes: a motor including a rotation shaft; an output shaft disposed coaxially to the rotation shaft; a rotation shaft side gear provided so as to be rotatable as a unit with the rotation shaft; an output shaft side gear provided so as to be rotatable as a unit with the output shaft; an intermediate gear configuration body that meshes with the rotation shaft side gear and the output shaft side gear, that is provided between the rotation shaft side gear and the output shaft side gear, and that includes a first intermediate gear and a second intermediate gear provided so as to be rotatable as a unit with the first intermediate gear and disposed further to the radial direction outside of the motor than the first intermediate gear; a first bearing that supports an end portion of the intermediate gear configuration body at a side of the first intermediate gear; and a second bearing that supports another end portion of the intermediate gear configuration body at a side of the second intermediate gear.

According to the actuator of the first aspect, the rotation shaft side gear rotates when the rotation shaft of the motor rotates. Moreover, when the rotation shaft side gear rotates, the first intermediate gear, which meshes with the rotation shaft side gear, rotates together with the second intermediate gear. Namely, the intermediate gear configuration body rotates. Moreover, the output shaft side gear, which meshes with the second intermediate gear of the intermediate gear configuration body, rotates when the intermediate gear configuration body rotates. The output shaft is thereby rotated. In configurations in which an intermediate gear configuration body is cantilever-supported, in order to suppress center misalignment of the intermediate gear configuration body during operation of the actuator, it is conceivable that an increase in the thickness of a portion supporting the intermediate gear configuration body will be necessary, or an increase in rigidity will be necessary, such as by increasing the diameter of the intermediate gear configuration body. However, in the present aspect, the end portion at the first intermediate gear side and the end portion at the second intermediate gear side of the intermediate gear configuration body are supported by the first bearing and the second bearing, respectively. Namely, the intermediate gear configuration body is supported at both ends by the first bearing and the second bearing. This suppresses an increase in the size of portions of the intermediate gear configuration body, or suppresses the intermediate gear configuration body from becoming larger in the radial direction compared to configurations in which the intermediate gear configuration body is cantilever-supported. The present aspect can thereby suppress the frame of the actuator from increasing in size.

An actuator of a second aspect of the disclosures is the actuator of the first aspect, wherein an outer diameter of the second bearing is larger than an outer diameter of the first bearing.

According to the actuator of the second aspect, the durability of the actuator can be improved due to setting the diameter of the second bearing that supports a thrust force produced in the intermediate gear configuration body greater than the diameter of the first bearing.

An actuator of a third aspect of the disclosures is the actuator of the first or second aspect, further includes a gear housing, wherein the rotation shaft side gear, the output shaft side gear, and the intermediate gear configuration body are housed inside the gear housing, and a restriction portion that restricts movement of the intermediate gear configuration body toward a first intermediate gear side with respect to the gear housing is provided at at least one out of the gear housing, the second bearing, or the intermediate gear configuration body.

According the actuator of the third aspect, movement of the intermediate gear configuration body toward the first intermediate gear side can be suppressed by providing the restriction portion.

An actuator of a fourth aspect of the disclosures is the actuator of the third aspect, wherein the restriction portion is provided at proximity location to the second bearing.

According to the actuator of the fourth aspect, space for providing the restriction portion can be easily secured due to disposing the restriction portion at proximity location to the second bearing.

An actuator of a fifth aspect of the disclosure is the actuator of the fourth aspect, wherein the restriction portion is provided at the second bearing, and the restriction portion is disposed between the gear housing and a retaining member that is attached to the gear housing.

According to the actuator of the fifth aspect, displacement of the second bearing with respect to the gear housing can be suppressed when the thrust force is input to the second bearing from the intermediate gear configuration body. Moreover, the second bearing can be employed to effectively suppress movement of the intermediate gear configuration body in the rotation shaft direction by configuring such that the second bearing is fixed to the gear housing by disposing the restricting portion of the second bearing between the gear housing and the retaining member.

An actuator of a sixth aspect of the disclosure is the actuator of any one of the first aspect to the fifth aspect, wherein, in cross-section taken along axial directions of the rotation shaft and the output shaft, an end of the first intermediate gear at a side of the output shaft is disposed further to an output shaft side than an end of the output shaft side gear at a side of the motor.

According to the actuator of the sixth aspect, disposing the first intermediate gear and the output shaft side gear as described above enables the clearance between the motor and the output shaft side gear to be suppressed from increasing. The present aspect thereby enables the axial direction dimension of the actuator to be suppressed from increasing.

An actuator of a seventh aspect of the disclosure is the actuator of any one out of the first aspect to the sixth aspect, wherein angles of the rotation shaft side gear, the first intermediate gear, the second intermediate gear, and the output shaft side gear are set such that a direction of a thrust force produced by the rotation shaft side gear meshing with the first intermediate gear is a direction opposite to a direction of a thrust force produced by the second intermediate gear meshing with the output shaft side gear.

According to the actuator of the seventh aspect, setting the direction of the thrust force produced in the intermediate gear configuration body as described above enables the thrust force input to the first bearing or the second bearing from the intermediate gear configuration body to be reduced. The present aspect thereby enables the durability of the actuator to be improved.

An actuator of an eighth aspect of the disclosure is the actuator of any one out of the first aspect to the seventh aspect, wherein the motor is configured including a stator, and a rotor disposed at a radial direction inside of the stator, and a dimension of the stator in the rotation shaft axial direction is set shorter than a dimension of the stator in a motor radial direction.

According to the actuator of the eighth aspect, setting the dimensions of the stator of the motor as described above enables the dimensions of the actuator in the radial direction to be suppressed from increasing.

An actuator of a ninth aspect of the disclosure is the actuator of any one out of the first aspect to the eighth aspect, wherein a rotation axis direction of the intermediate gear configuration body is disposed orthogonal to a rotation axis direction of the rotation shaft.

According to the actuator of the ninth aspect, disposing the rotation shaft direction of the intermediate gear configuration body and the rotation shaft direction of the rotation shaft as described above enables a shortening to be achieved for the actuator in the axial direction.

An actuator of a tenth aspect of the disclosure is the actuator of any one out the first aspect to the ninth aspect, further including a detected portion that is provided at an end portion of the intermediate gear configuration body for detecting a rotation speed of the intermediate gear configuration body.

According to the actuator of the tenth aspect, the detected portion for detecting the rotation speed of the intermediate gear configuration body is provided at the end portion of the intermediate gear configuration body. This enables increases in the axial direction size of the actuator to be suppressed compared to cases in which the detected portion is provided at one end of the output shaft.

An actuator of an eleventh aspect of the disclosures is the actuator of the tenth aspect, wherein a detecting portion that detects the detected portion is disposed at an outside of the gear housing chamber.

According to the actuator of the eleventh aspect, it is unnecessary to provide space inside the gear housing for disposing the detecting portion. This enables the volume of the gear chamber to be suppressed from increasing, thereby enabling the axial direction size of the actuator to be further suppressed.

An actuator of a twelfth aspect of the disclosures is the actuator of the tenth or the eleventh aspect, wherein the detected portion is attached to an end portion of the intermediate gear configuration body at the second intermediate gear side, in a state so as to be disposed at a side opposite to the side of the first bearing with the second bearing interposed therebetween.

According to the actuator of the twelfth aspect, the detected portion can be attached to the intermediate gear configuration body in a state in which the first bearing and the second bearing have already been attached to the intermediate gear configuration body, by setting the detected portion so as to be disposed as described above. This enables the detected portion to be shaped without being restricted by an inner diameter of the second bearing. Namely, flexibility for design of the detected portion (in particular in relation to the size thereof) can be maintained.

An actuator of a thirteenth aspect of the disclosures is the actuator of the eleventh or the twelfth aspect, wherein: a circuit board, mounted with the detecting portion, is provided at one side in an axial direction of the intermediate gear configuration body; and a component attached to the circuit board and the output shaft side gear are disposed so as to overlap with each other as viewed along the axial direction of the output shaft.

According to the actuator of the thirteenth aspect, an increase in the radial direction size of the actuator can be suppressed due to disposing the component attached to the circuit board and the output shaft side gear so as to overlap with each other as viewed along the axial direction of the output shaft.

BRIEF DESCRIPTION OF THE DRAWINGS

Preferred embodiments will be described in detail based on the following figures, wherein:

FIG. 7B is an enlarged side cross-section illustrating a portion of the actuator illustrated in FIG. 7A taken along line 7B-7B;

FIG. 8A is a plan view illustrating a circuit board mounted with a sensor magnet for detecting the rotation speed of an output shaft and a Hall effect sensor, and the like;

FIG. 8B is an enlarged side cross-section corresponding to FIG. 7B, illustrating a location where the sensor magnet is provided.

DETAILED DESCRIPTION OF THE INVENTION

Figure 1:
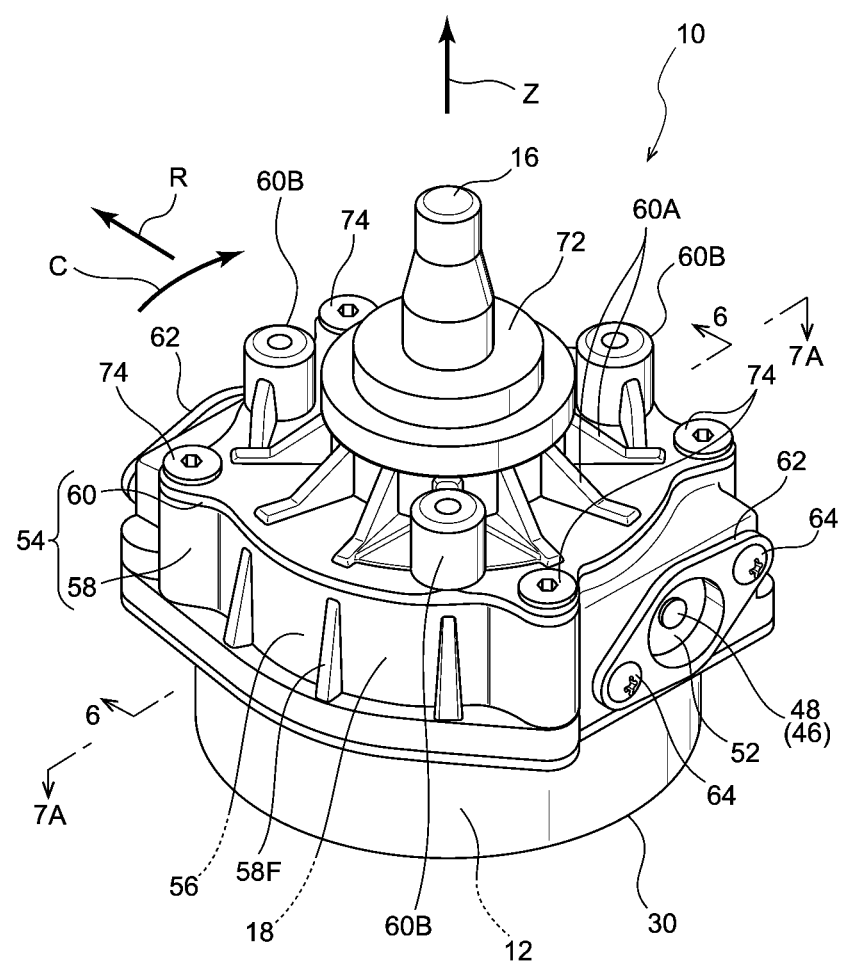
FIG. 1 is a perspective view from an actuator output shaft side.

Explanation follows regarding an actuator 10 according to an exemplary embodiment of the present invention, with reference to FIG. 1 to FIG. 8A. Note that in the drawings, the arrow Z direction, the arrow R direction, and the arrow C direction respectively indicate the axial direction, the radial direction, and the circumferential direction of a motor 12 configuring a portion of the actuator, as appropriate. Moreover, hereafter, references simply to the axial direction, radial direction, and circumferential direction, refer to the axial direction, the radial direction, and the circumferential direction of the motor 12, unless otherwise stated. Moreover, the axial direction, radial direction, and circumferential direction of the motor 12 respectively correspond to the axial direction, radial direction, and circumferential direction of a rotation shaft 14 of the motor 12 and an output shaft 16 of the actuator 10.

Figure 2:
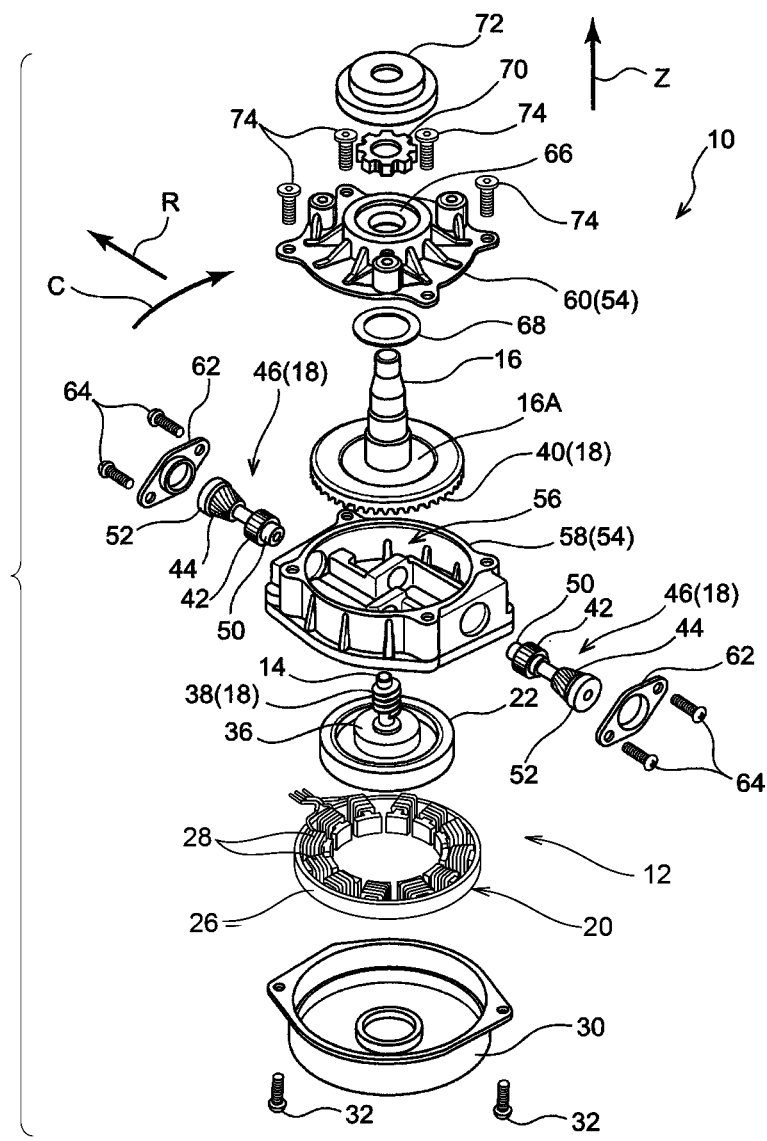
FIG. 2 is an exploded perspective view illustrating the actuator illustrated in FIG. 1.

As illustrated in FIG. 1 and FIG. 2, the actuator 10 of the present exemplary embodiment is a type of actuator that is disposed coaxially to the rotation shaft 14 and the output shaft 16 of the motor 12, and, as illustrated in FIG. 2, the actuator 10 includes the motor 12, and a speed reduction mechanism 18 that transmits to the output shaft 16 while reducing the rotation speed of the rotation shaft 14 of the motor 12 by a specific speed reduction ratio.

Figure 3:
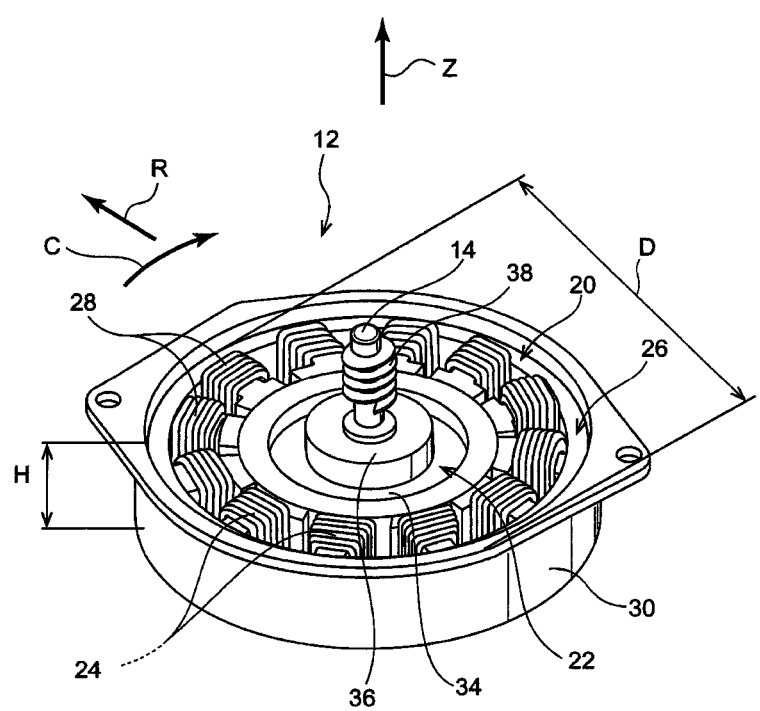
FIG. 3 is a perspective view illustrating a motor.

As illustrated in FIG. 3, the motor 12 is an inner-rotor type, ten pole twelve slot brushless motor. The motor 12 is configured including a stator 20 that generates a rotating magnetic field, and a rotor 22 that rotates due to the rotating magnetic field generated by the stator 20.

The stator 20 is configured including a stator core 26 that includes twelve individual teeth portions 24 arrayed at uniform intervals around the circumferential direction, and twelve individual coils 28 formed by winding (concentrated winding) conductive wires onto each of the teeth 24 of the stator core 26. Then the current to each of the coils 28 is switched, so as to generate a rotating magnetic field. Moreover, the stator 20 is fixed to a motor housing 30 formed in a hat-shape open at one axial direction side (the arrow Z direction side), and, as illustrated in FIG. 1 and FIG. 2, the motor housing 30 is fixed to a gear housing 54, described later, through bolts 32. Moreover, as illustrated in FIG. 3, in the present exemplary embodiment, an axial direction dimension H of the stator 20 is set shorter than a diameter direction dimension D of the stator 20.

Figure 6A:
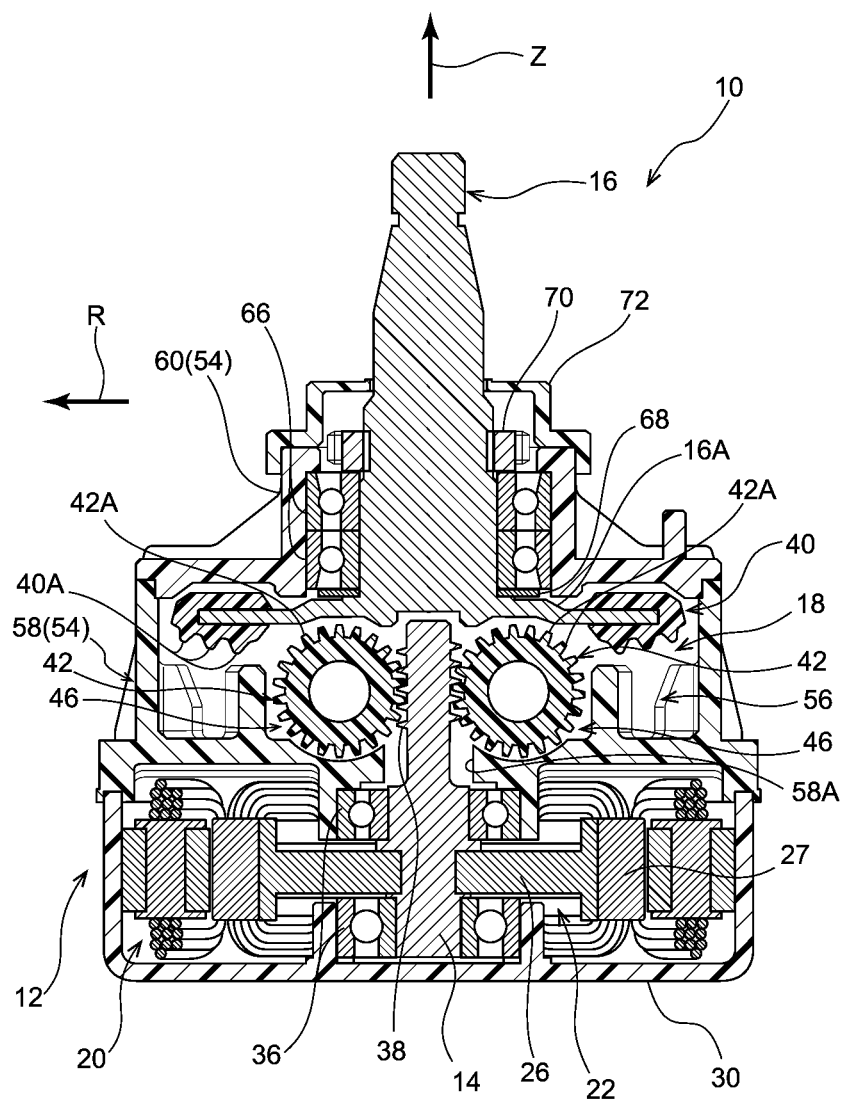
FIG. 6A is a side cross-section illustrating the actuator illustrated in FIG. 1 taken along line 6-6.
Figure 6B:
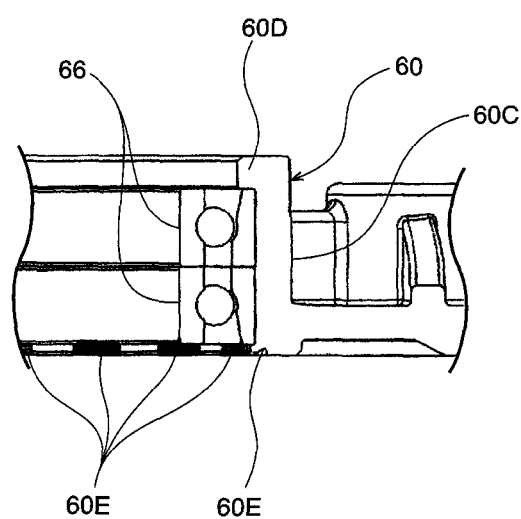
FIG. 6B is an enlarged cross-section illustrating a portion where a pair of bearing is fixed in a gear housing cover.

As illustrated in FIG. 3 and FIG. 6A, the rotor 22 disposed at the radial direction inside of the stator 20 is configured including a rotor core 34 formed in a circular column shape, a rotation shaft 14 fixed to an axial center portion of the rotor core 34, and ten magnets 27 fixed to an outer circumference of the stator core 26 (see FIG. 6A). Moreover, the rotor 22 is supported through two bearings 36 by the gear housing 54, described later, and the motor housing 30. Note that although in the present exemplary embodiment the magnets 27 are configured by surface permanent magnets (SPMs) fixed to the outer circumferential face of the rotor core 34, the present invention is not limited thereto, and the magnets 27 may be configured as interior permanent magnets (IPMs) embedded inside the rotor core 34.

As illustrated in FIG. 2, the speed reduction mechanism 18 is configured including a rotating shaft side gear 38 provided capable of rotating as a unit with the rotation shaft 14, an output shaft side gear 40 provided capable of rotating as a unit with the output shaft 16, and a pair of intermediate gear configuration bodies 46 that are provided between the rotating shaft side gear 38 and the output shaft side gear 40, and that each include a first intermediate gear 42 enmeshed with the rotating shaft side gear 38 and a second intermediate gear 44 enmeshed with the output shaft side gear 40.

Figure 4:
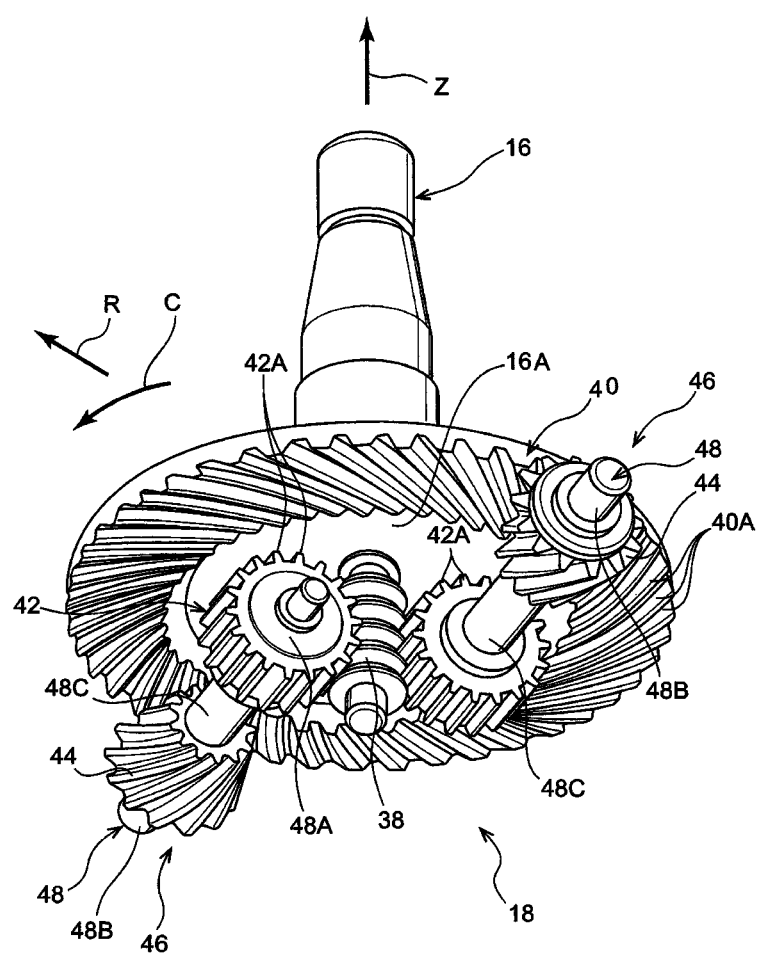
FIG. 4 is a perspective view illustrating a speed reduction mechanism.

As illustrated in FIG. 3 and FIG. 4, the rotating shaft side gear 38 is a worm formed, as an example, by performing rolling on an end portion at one axial direction side of the metal rotation shaft 14. Note that configuration may be made with a worm formed using a resin material or the like attached to the axial direction end portion of the rotation shaft 14.

Figure 5:
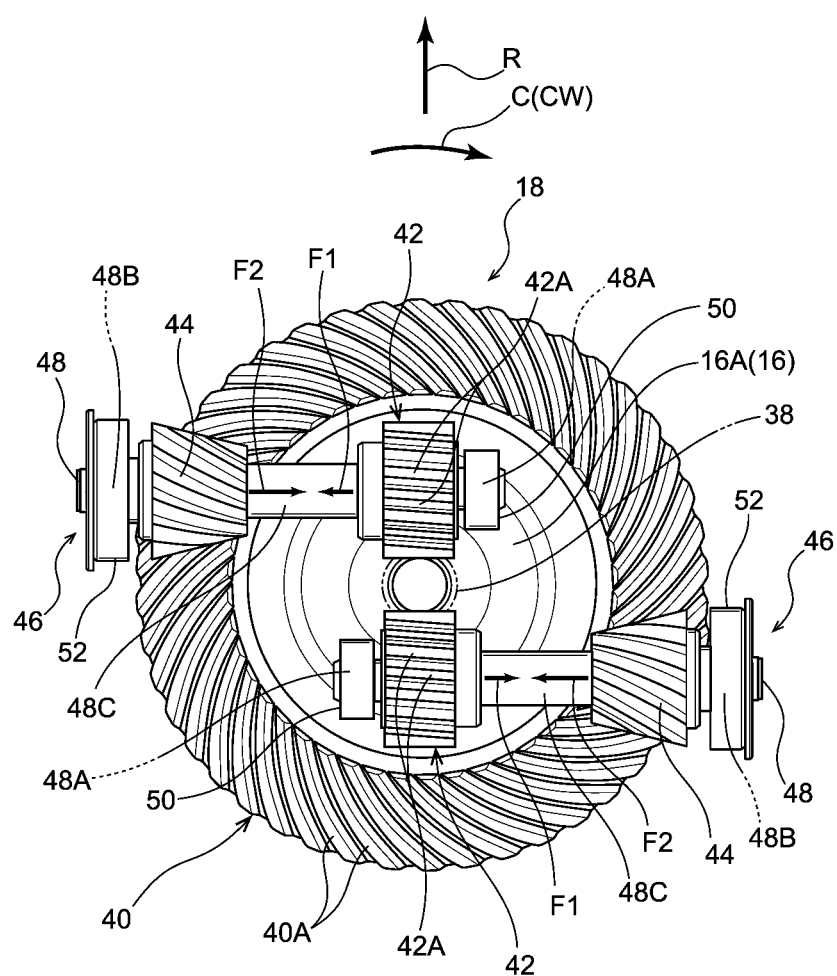
FIG. 5 is a plan view illustrating a speed reduction mechanism.

As illustrated in FIG. 4 and FIG. 5, the output shaft side gear 40 is provided at an outer circumferential portion of a circular plate portion provided at an end portion at the other axial direction side of the output shaft 16, thereby enabling the output shaft side gear 40 and the output shaft 16 to rotate as a unit. Moreover, the output shaft side gear 40 is a hypoid gear that is formed with forty-five teeth, and that gradually narrows on progression toward the other axial direction side as viewed from the side. Moreover, in the present exemplary embodiment, the end of the output shaft side gear 40 on the other axial direction side, namely, tooth tips 40A of the output shaft side gear 40, is positioned further to the other axial direction side than a face on the other axial direction side of the circular plate portion 16A of the output shaft 16.

The pair of intermediate gear configuration bodies 46 are provided between the rotating shaft side gear 38 and the output shaft side gear 40, and, as viewed along the axial direction, the pair of intermediate gear configuration bodies 46 are disposed with point symmetry to each other, with the center of the rotation shaft 14 and the output shaft 16 as the center of symmetry, and the pair of intermediate gear configuration bodies 46 are disposed parallel to each other. Moreover, each of the intermediate gear configuration bodies 46 includes a metal rod shaped shaft portion 48 that extends in a direction orthogonal to the axial direction, with the first intermediate gear 42 and the second intermediate gear 44 respectively provided at one side and the other side in the length direction of the shaft portion 48.

An end portion at one length direction side of the shaft portion 48 configures a first bearing fixing portion 48A on to which the inner race of a first bearing 50, serving as a first bearing, is fixed by press fitting. Moreover, an end portion at the other length direction side of the shaft portion 48 configures a second bearing fixing portion 48B on to which an inner race of a second bearing 52, serving as a second bearing configured with a larger diameter than the first bearing 50, is fixed by press fitting. Note that in the present exemplary embodiment, both length direction end portions of the shaft portion 48 are crimped at four places along the circumferential direction such that the first bearing 50 and the second bearing 52 cannot separate from the first bearing fixing portion 48A and the second bearing fixing portion 48B (see FIG. 7B). Moreover, an intermediate portion along the shaft portion 48, between the location where the first intermediate gear 42 is provided and the location where the second intermediate gear 44 is provided, configures a connecting portion 48C, having a smaller diameter than the external diameters of the first intermediate gear 42 and the second intermediate gear 44. Moreover, as illustrated in FIG. 7B, in the present exemplary embodiment, a flange portion 52B serving as a restriction portion is formed at an end portion at one side of an outer race 52A of the second bearing 52.

As illustrated in FIG. 4 and FIG. 5, the first intermediate gear 42 is a worm wheel that has seventeen teeth and meshes with the rotating shaft side gear 38. The first intermediate gear 42 is provided further to the other length direction side (the second bearing fixing portion 48B side) of the shaft portion 48 than the first bearing fixing portion 48A of the shaft portion 48. Moreover, the first intermediate gear 42 is made from resin, and the first intermediate gear 42 is configured so as to be capable of rotating as a unit with the shaft portion 48 by affixing the first intermediate gear 42 to the shaft portion 48. Moreover, when the output shaft 16 of the motor 12 is rotated clockwise as viewed from the one axial direction side (rotated in the arrow CW direction), a thrust force F1 is produced in each of the intermediate gear configuration bodies 46 due to the rotating shaft side gear 38 meshing with the first intermediate gears 42. The angle of the rotating shaft side gear 38 with respect to the axial direction of the rotation shaft 14 and the angle of the first intermediate gear 42 with respect to an axial direction of the shaft portion 48 are set such that the direction of the thrust force F1 is a direction facing from the one side to the other side along the length of the shaft portion 48 (from the first bearing fixing portion 48A side toward the second bearing fixing portion 48B side).

The second intermediate gear 44 is a hypoid pinion gear having thirteen teeth that meshes with the output shaft side gear 40. The second intermediate gear 44 is formed so as to narrow on progression toward the one length direction side of the shaft portion 48 (the first bearing fixing portion 48A side). Moreover, the second intermediate gear 44 is provided further to the one length direction side of the shaft portion 48 (the first bearing fixing portion 48A side) than the second bearing fixing portion 48B of the shaft portion 48. Moreover, in the present exemplary embodiment, the second intermediate gear 44 is formed to the location of the shaft portion 48 described above by performing rolling on a portion of the shaft portion 48. Moreover, when the output shaft 16 of the motor 12 is rotated clockwise as viewed from the one axial direction side of the output shaft 16 (rotated in the arrow CW direction), a thrust force F2 is produced in each of the intermediate gear configuration bodies 46 due to the second intermediate gears 44 meshing with the output shaft side gear 40. The angle of the second intermediate gear 44 with respect to the axial direction of the shaft portion 48 and the angle of the output shaft side gear 40 with respect to the radial direction of the output shaft 16 are set such that the direction of the thrust force F2 is a direction facing from the other side to the one side along the length of the shaft portion 48 (from the second bearing fixing portion 48B side to the first bearing fixing portion 48A side). Namely, the angles of the rotating shaft side gear 38, the first intermediate gear 42, the second intermediate gear 44, and the output shaft side gear 40 are set such that the direction of the thrust force F2 and the direction of the thrust force F1 produced in the intermediate gear configuration bodies 46 are opposite directions to each other. Moreover, in the present exemplary embodiment, the thrust force F1 produced in the intermediate gear configuration bodies 46 is smaller than the thrust force F2 during operation of the actuator 10.

As illustrated in FIG. 6A, the speed reduction mechanism 18 described above is disposed inside a gear housing chamber 56 formed inside the gear housing 54 provided at the one axial direction side of the motor 12. The gear housing 54 that forms the gear housing chamber 56 includes a gear housing body 58 formed in a box shape open at the output shaft 16 side, and a gear housing cover 60 that closes off the open end of the gear housing body 58.

Figure 7A:
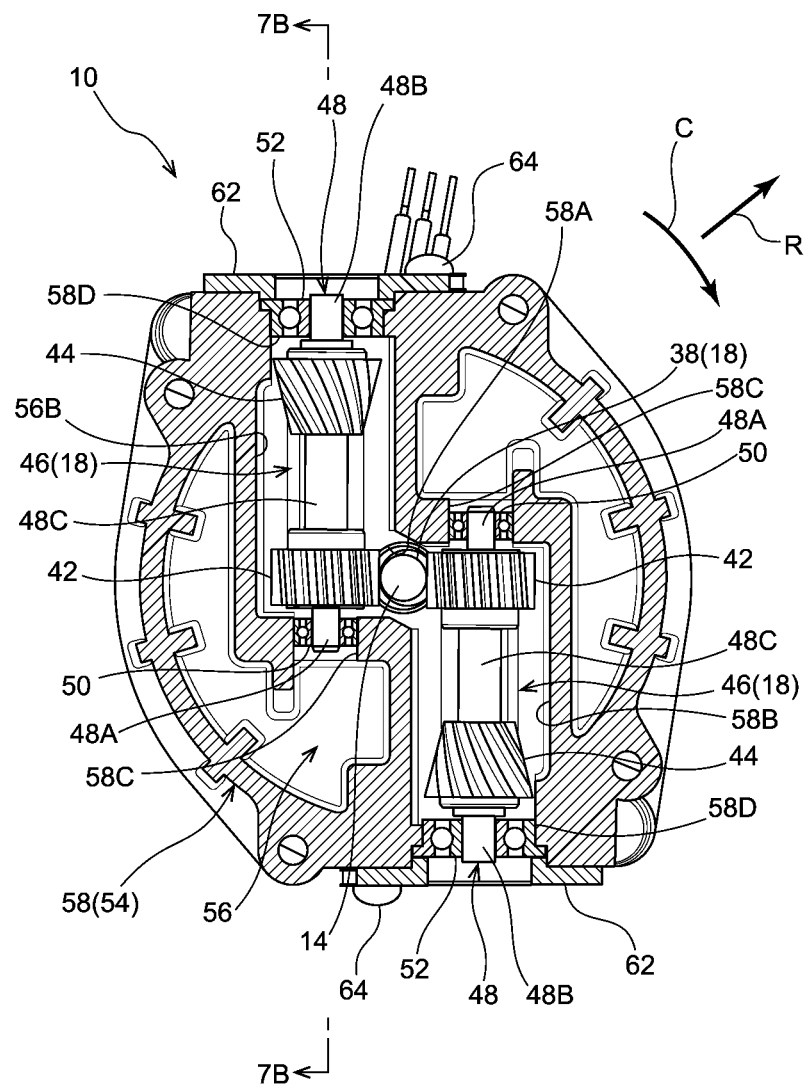
FIG. 7A is a plan cross-section illustrating the actuator illustrated in FIG. 1 taken along line 7A-7A.

A rotation shaft insertion hole 58A through which the rotation shaft 14 is inserted is formed at a central portion in the radial direction of the gear housing body 58. Moreover, as illustrated in FIG. 7A, a pair of intermediate gear configuration body housing portions 58B that house the pair of intermediate gear configuration bodies 46 described above are respectively provided at the one radial direction side and the other radial direction side of the gear housing body 58, on either side of the center of the rotation shaft insertion hole 58A. Moreover, a first bearing support hole 58C, into which the outer race of the first bearing 50 is inserted with play, is formed to one end (the radial direction inside) of each of the intermediate gear configuration body housing portions 58B. Moreover, as illustrated in FIG. 7B, the second bearing support hole 58D, into which a portion 52C of the outer race 52A of the second bearing 52 not formed with the flange portion 52B is inserted with play, is formed to the other end (the radial direction outside) of each of the intermediate gear configuration body housing portions 58B. The intermediate gear configuration bodies 46, with the first bearing 50 and the second bearing 52 attached, are inserted into the second bearing support hole 58D, such that movement of the second bearing 52 toward the inside of the gear housing 54 (movement toward the first intermediate gear 42 side) is restricted due to the flange portion 52B of the second bearing 52 abutting a circumferential edge portion 58E of the second bearing support hole 58D. Moreover, a second bearing retaining member 62, serving as a retaining member, is fixed to the gear housing body 58 by bolts 64 (see FIG. 2), such that the flange portion 52B of the second bearing 52 is disposed between the circumferential edge portion 58E of the second bearing support hole 58D and a second bearing retaining member 62. The intermediate gear configuration bodies 46 fixed with the first bearing 50 and the second bearing 52 is thereby attached to the gear housing body 58. Moreover, the flange portion 52B of the second bearing 52 is disposed between the circumferential edge portion 58E of the second bearing support hole 58D and the second bearing retaining member 62 such that thrust force toward the one side and the other side in the length direction of the shaft portion 48 can be borne by the second bearing 52. Note that, as illustrated in FIG. 1, rigidity regulating lower level ribs 58F project out from the outer circumferential portion of the gear housing body 58.

Moreover, as illustrated in FIG. 6A, a pair of bearings 66, which support the output shaft 16 and are disposed adjacent to each other in the axial direction, are fixed to a radial direction central portion of the gear housing cover 60. More precisely, the bearing insertion portion 60C, formed with a cylindrical shape, is provided at a central portion in the radial direction of the gear housing cover 60. Moreover, a flange shaped bearing abutting portion 60D, protruding toward the radial direction inside, is provided at one axial direction end portion of the bearing insertion portion 60C. The pair of bearings 66 are inserted into the bearing insertion portion 60C from the other axial direction side toward the one axial direction side, such that the outer race of the bearing 66 that is disposed at the one axial direction side abuts the bearing abutting portion 60D. A portion of the bearing insertion portion 60C at the other axial direction side (the portion indicated by reference numeral 60E, see also FIG. 6B) is crimped such that the pair of bearings 66 are not able to come out from the bearing insertion portion 60C. Moreover, a washer 68 is interposed between the inner race of the bearing 66 that is disposed at the other axial direction side out of the pair of bearings 66, and the circular plate portion 16A provided at the other axial direction side of the output shaft 16. Moreover, in a state in which the output shaft 16 is inserted into the inner race of the pair of bearings 66, a retaining member 70 is attached to the output shaft 16. The inner race of the pair of bearings 66 is thereby placed in a state interposed between the retaining member 70 and the circular plate portion 16A of the output shaft 16. As a result, the output shaft 16 is not able to come out from the pair of bearings 66. Applying the above configuration restricts movement of the output shaft 16 with respect to the gear housing cover 60 in the axial direction. A load in the axial direction that is imparted to the output shaft 16 is distributed through the pair of bearings 66 to the gear housing cover 60, and the load transferred to the gear housing cover is further distributed through bolts 74 (see FIG. 2), described later, to the gear housing body 58. Moreover, a cap 72, having an insertion hole through which the output shaft 16 is inserted, is attached to the gear housing cover 60. Water drops and the like adhered to the actuator 10 are thereby suppressed from penetrating to the bearing 66 side. Note that, as illustrated in FIG. 1, upper level ribs 60A, which reinforce the location where the pair of bearings 66 are fixed, project out from the gear housing cover 60. Moreover, three bosses 60B, disposed at intervals along the circumferential direction, project out from the gear housing cover 60. Bolts, not illustrated in the drawings, are screwed into the three bosses 60B so as to enable the actuator 10 to be fixed to a fixing portion or the like of an automobile.

Fixing the gear housing cover 60 described above to the gear housing body 58 through the bolts 74 (see FIG. 2) thereby forms the gear housing chamber 56, in which the rotating shaft side gear 38, the intermediate gear configuration bodies 46, and the output shaft side gear 40 that configure the speed reduction mechanism 18 are housed, between the gear housing cover 60 and the gear housing body 58. In a state in which the rotating shaft side gear 38, the intermediate gear configuration bodies 46, and the output shaft side gear 40 are housed in the gear housing chamber 56, the output shaft 16 side end of the first intermediate gear 42 (tooth tips 42A of the first intermediate gear 42) is disposed further to the output shaft 16 side than the motor side end of the output shaft side gear 40 (the tooth tips 40A of the output shaft side gear 40) in a cross sectional view along the axial direction of the motor.

Figure 8A:
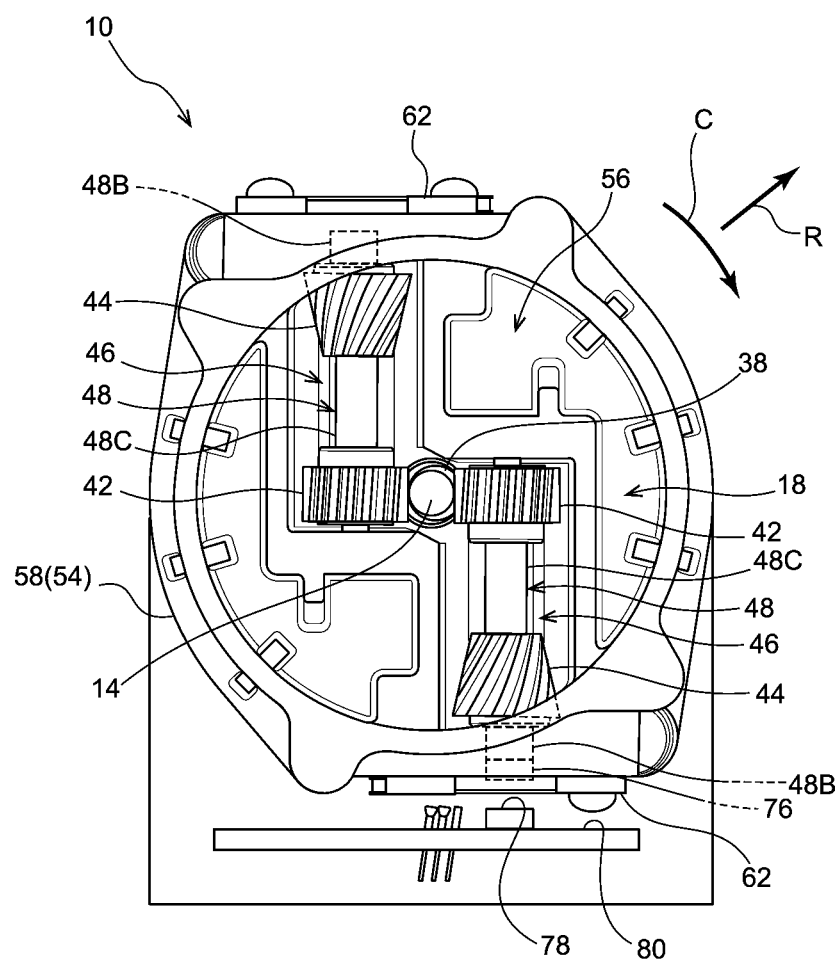

Moreover, as illustrated in FIG. 8A, in the present exemplary embodiment, a circuit board 80, that is mounted with a sensor magnet 76, serving as a detected portion for detecting the rotation speed and rotation angle of the output shaft 16, and a Hall effect sensor 78, serving as a detecting portion for detecting the magnetism of the sensor magnet 76, is provided.

As illustrated in FIG. 8B, the sensor magnet 76 is fixed at an end portion at the length direction other side (an end portion at the second bearing fixing portion 48B side) of the shaft portion 48 of one of the intermediate gear configuration bodies 46 by using a sensor magnet support member 90. The sensor magnet support member 90 includes a circular pillar shaped press-fit portion 90A, which is press-fitted into a press-fitting hole 48D formed in an end portion of the shaft portion 48 at the other length direction side thereof. Moreover, the sensor magnet support member 90 includes a circular plate portion 90B that is provided at one end of the press-fit portion 90A with an axial direction thereof being along an axial direction of the press-fit portion 90A. The circular plate portion 90B includes a hook portion 90C that is formed at an outer circumferential portion of the circular plate portion 90B. The sensor magnet 76 is retained by the hook portion 90C and the circular plate portion 90B such that the sensor magnet 76 is fixed to the sensor magnet support member 90. Moreover, in a state in which the sensor magnet 76 is fixed to the sensor magnet support member 90, the press-fit portion 90A of the sensor magnet support member 90 is press-fitted into the press-fitting hole 48D formed in the end portion of the shaft portion 48 at the other length direction side thereof. The sensor magnet 76 is thereby fixed to the shaft portion 48, with the sensor magnet 76 configured so as to be capable of rotating as a unit with the shaft portion 48.

Moreover, the circuit board 80 is fixed to the gear housing body 58 through a circuit board support member, not illustrated in the drawings, in a state in which the circuit board 80 is disposed at the outside of the gear housing 54 (the outside of the gear housing chamber 56). Moreover, a circuit board covering member, not illustrated in the drawings, is attached to the gear housing body 58, thereby achieving a configuration in which the circuit board 80 is disposed inside a sealed space formed between the gear housing body 58 and the circuit board covering member. Moreover, in a state in which the circuit board 80 is fixed to the gear housing body 58, the Hall effect sensor 78 mounted to the circuit board 80 is disposed at the other length direction side of the shaft portion 48 of one of the intermediate gear configuration bodies 46, and is disposed with a specific clearance from the sensor magnet 76.

Operation and Advantageous Effects of Present Exemplary Embodiment

Next, explanation follows regarding operation and advantageous effects of the present exemplary embodiment.

As illustrated in FIG. 1 to FIG. 3, according to the actuator 10 of the present exemplary embodiment, when the rotation shaft 14 of the motor 12 rotates, the rotating shaft side gear 38 rotates with the rotation shaft 14. Moreover, when the rotating shaft side gear 38 rotates, the first intermediate gears 42, which are enmeshed with the rotating shaft side gear 38, rotate with the second intermediate gears 44. Namely, the intermediate gear configuration bodies 46 rotate. Moreover, when the intermediate gear configuration bodies 46 rotate, the output shaft side gear 40, which is enmeshed with the second intermediate gears 44 of the intermediate gear configuration bodies 46, also rotates. The output shaft 16 therefore rotates.

In configurations in which an intermediate gear configuration body 46 is cantilever-supported, in order to suppress center misalignment of the intermediate gear configuration body 46 during operation of the actuator 10, it is conceivable that an increase in the thickness of the portion supporting the intermediate gear configuration body 46 will be necessary, or an increase in rigidity will be necessary, such as by increasing the diameter of the intermediate gear configuration body 46.

However, in the present exemplary embodiment, as illustrated in FIG. 7A, the end portions of the intermediate gear configuration body 46 at the first intermediate gear 42 side and at the second intermediate gear 44 side are supported by the first bearing 50 and the second bearing 52, respectively. Namely, the length direction both end portions of the intermediate gear configuration bodies are supported by the first bearing 50 and the second bearing 52. This suppresses an increase in the size of the portions supporting the intermediate gear configuration bodies 46, or suppresses the intermediate gear configuration body 46 from becoming larger in the radial direction compared to configurations in which the intermediate gear configuration bodies 46 are cantilever-supported. The present exemplary embodiment can thereby suppress the frame of the actuator 10 from increasing in size.

Moreover, in the present exemplary embodiment, setting the diameter of the second bearing 52, that supports the thrust force, produced in each of the intermediate gear configuration bodies 46, larger than the diameter of the first bearing 50 enables the durability of the actuator 10 to be improved.

Moreover, in the present exemplary embodiment, setting the angles of the rotating shaft side gear 38, the first intermediate gear 42, the second intermediate gear 44, and the output shaft side gear 40 with respect to a specific axis so that the direction of the thrust force F2 and the direction of the thrust force F1 produced in each of the intermediate gear configuration bodies 46 are in opposing directions to each other enables the thrust force input to the second bearing 52 from the intermediate gear configuration bodies (the combined force of the thrust force F1 and the thrust force F2) to be reduced. This thereby enables, in the present exemplary embodiment, the durability of the actuator 10 to be improved.

Moreover, in the present exemplary embodiment, as illustrated in FIG. 6A, in a state in which the rotating shaft side gear 38, the intermediate gear configuration body 46, and the output shaft side gear 40 are housed in the gear housing chamber 56, the end of the first intermediate gear 42 at the output shaft 16 side (the tooth tips 42A of the first intermediate gear 42) is disposed further to the output shaft 16 side than the end of the output shaft side gear 40 at the motor side (the tooth tips 40A of the output shaft side gear 40) in the cross sectional view in the axial direction of the motor 12. Disposing the first intermediate gear 42 and the output shaft side gear 40 as described above enables the clearance between the motor 12 and the output shaft side gear 40 to be suppressed from increasing. The present exemplary embodiment thereby enables the axial direction dimension of the actuator 10 to be suppressed from increasing.

Moreover, in the present exemplary embodiment, as illustrated in FIG. 3, the axial direction dimension H of the stator 20 is set shorter than the diameter direction dimension D of the stator 20. Setting the dimensions in the stator 20 of the motor 12 as described enables increases in the dimension of the actuator 10 in the axial direction to be suppressed.

Moreover, in the present exemplary embodiment, as illustrated in FIG. 4 to FIG. 8A, the pair of intermediate gear configuration bodies 46 are provided between the rotating shaft side gear 38 and the output shaft side gear 40, and this enables the driving force of the rotating shaft side gear 38 to be distributed through the pair of intermediate gear configuration bodies 46 and transmitted to the output shaft side gear 40. The present exemplary embodiment thereby enables the torque transmission capacity of the speed reduction mechanism 18 to be increased.

Moreover, in the present exemplary embodiment, as illustrated in FIG. 8A, the sensor magnet 76 for detecting the rotation speed and rotation angle of the output shaft 16 is provided at the end portion of the intermediate gear configuration body 46. An increase to the axial direction dimension of the actuator 10 can thereby be suppressed compared to cases in which the sensor magnet 76 is provided at the end portion of the output shaft 16 at the other axial direction side (to the circular plate portion 16A). Note that the rotation speed and rotation angle of the output shaft 16 are computed by multiplying the ratio of the output shaft side gear 40 to the second intermediate gear 44 by the rotation speed and rotation angle of the intermediate gear configuration body 46. Moreover, computing the rotation speed and rotation angle of the output shaft 16 by this computation enables the precision (resolution) of the rotation speed and rotation angle of the output shaft 16 to be increased.

Moreover, in the present exemplary embodiment, the sensor magnet 76 is attached to the end portion of the intermediate gear configuration body 46 at the second intermediate gear 44 side by using the sensor magnet support member 90, in a state in which the sensor magnet 76 is disposed at the opposite side with respect to the second bearing 52 to the first bearing 50 side. This thereby enables the sensor magnet 76 to be attached to the intermediate gear configuration body 46 in a state in which the first bearing 50 and the second bearing 52 have already been attached to the intermediate gear configuration body 46. This enables the shape of the sensor magnet 76 to be configured without restricted by the inner diameter of the second bearing 52. Namely, in the present exemplary embodiment, the flexibility for design of the sensor magnet 76 (especially relating to size) can be maintained.

Moreover, in the present exemplary embodiment, by adopting a configuration in which space is not provided in the gear housing chamber 56 for disposing the circuit board 80 and the Hall effect sensor 78 mounted to the circuit board 80, the gear housing chamber 56 can be suppressed from increasing in volume, thereby enabling the axial direction dimension of the actuator 10 to be suppressed from increasing.

Moreover, in the present exemplary embodiment, the rotation axis direction of the intermediate gear configuration body 46 and the rotation axis direction of the output shaft 16 are disposed orthogonal to each other. Disposing in this manner enables a reduction in the axial direction size of the actuator 10 to be achieved.

In the present exemplary embodiment, explanation has been given regarding an example that includes a circuit board 80 mounted with a sensor magnet 76 for detecting the rotation speed and rotation angle of the output shaft 16 and a Hall effect sensor 78 for detecting the magnetism of the sensor magnet 76. However, the present invention is not limited thereto. For example, in an actuator where there is no need to control the rotation speed and rotation angle of the output shaft 16, configuration may be made in which the circuit board 80 mounted with the sensor magnet 76 and the Hall effect sensor 78 is not provided.

Moreover, in the present exemplary embodiment, explanation has been given regarding an example in which the pair of intermediate gear configuration bodies 46 is provided between the rotating shaft side gear 38 and the output shaft side gear 40. However, the present invention is not limited thereto. For example, a single intermediate gear configuration body 46 may be provided between the rotating shaft side gear 38 and the output shaft side gear 40. The number of intermediate gear configuration bodies 46 may be appropriately set in this manner in consideration of the torque transmission capacity of the speed reduction mechanism 18 and the like.

Moreover, in the present exemplary embodiment, explanation has been given regarding an example in which the actuator 10 is configured using a motor 12 in which the axial direction dimension H of the stator 20 is set shorter than the diameter direction dimension D of the stator 20. However, the present invention is not limited thereto. For example, an actuator may be configured using a motor in which the axial direction dimension of the stator is set longer than the diameter dimension of the stator. Moreover, the actuator may be configured using, for example, an outer rotor-type brushless motor or a direct current brush motor.

Moreover, in the present exemplary embodiment, explanation has been given regarding an example in which the angles of the rotating shaft side gear 38, the first intermediate gear 42, the second intermediate gear 44, and the output shaft side gear 40 with respect to a specific axis are set such that the direction of the thrust force F2 and the direction of the thrust force F1 produced in the intermediate gear configuration bodies 46 are opposite directions to each other. However, the present invention is not limited thereto. The direction of the thrust force F2 and the direction of the thrust force F1 produced in the intermediate gear configuration bodies 46 may be appropriately set in consideration of, for example, processing costs for each of the gears configuring the speed reduction mechanism 18.

Moreover, in the present exemplary embodiment, explanation has been given regarding an example in which the diameter of the second bearing 52 is set so as to be larger than the diameter of the first bearing 50. However, the present invention is not limited thereto. The diameter of the first bearing 50 and the second bearing 52 may be set appropriately in consideration of, for example, the lifespan required for the first bearing 50 and the second bearing 52.

Moreover, in the present exemplary embodiment, explanation has been given regarding an example in which the end of the first intermediate gear 42 at the output shaft 16 side (the tooth tips 42A of the first intermediate gear 42) is disposed at further to the output shaft 16 side than the end of the output shaft side gear 40 at the motor side (the tooth tips 40A of the output shaft side gear 40) in a state in which the rotating shaft side gear 38, the intermediate gear configuration body 46, and the output shaft side gear 40 are housed in the gear housing chamber 56. However, the present invention is not limited thereto. Whether or not the first intermediate gear 42 and the output shaft side gear 40 are disposed as described above may be appropriately set in consideration of, for example, the speed reduction ratio of the speed reduction mechanism 18.

Moreover, in the present exemplary embodiment, explanation been given regarding an example in which the rotation axis direction of the intermediate gear configuration body 46 and the rotation axis direction of the output shaft 16 are disposed orthogonal to each other. However, the present invention is not limited thereto. For example, the intermediate gear configuration body 46 may be disposed inclined with respect to a direction orthogonal to the axial direction of the output shaft 16, such that the second intermediate gear 44 is disposed further to the other axial direction side than the first intermediate gear 42.

Moreover, in the present exemplary embodiment, explanation has been given regarding an example configured such that the flange portion 52B of the second bearing 52 is disposed (interposed) between the circumferential edge portion 58E of the second bearing support hole 58D and the second bearing retaining member 62, thereby restricting movement with respect to the gear housing body 58 of each of the intermediate gear configuration bodies 46 to which the first bearing 50 and the second bearing 52 are fixed. However, the present invention is not limited thereto. Namely, it is sufficient to provide a restriction portion to at least one out of the second bearing 52 or the intermediate gear configuration body 46 such that movement of the intermediate gear configuration body 46 with respect to the gear housing body 58 is restricted.

Modified Example of the Above Exemplary Embodiment

Figure 9:
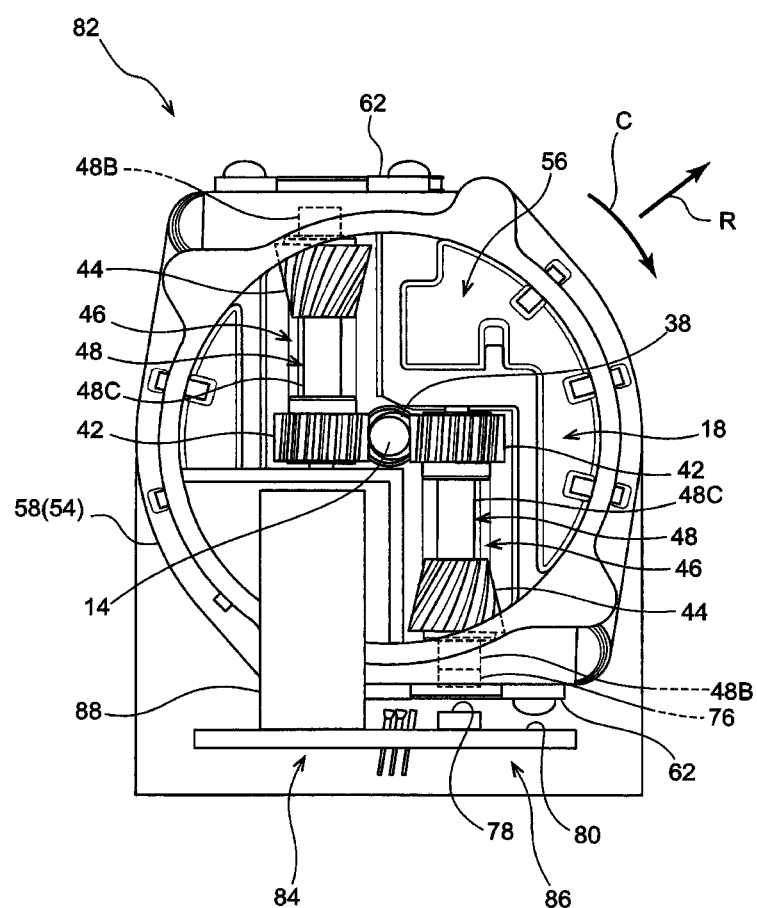
FIG. 9 is a plan view corresponding to FIG. 8 and illustrating a circuit board, a housing body, and the like of an actuator according to a modified example.

Next, explanation follows regarding an actuator 82 according to a modified example of the above exemplary embodiment, with reference to FIG. 9. Note that members and portions having similar functionality to the above exemplary embodiment are allocated the same reference numerals as in the above exemplary embodiment, and explanation thereof is omitted.

As illustrated in FIG. 9, the actuator 82 according to the present modified example is provided with a circuit board 80 including a motor drive controller 84 that controls the rotation of the motor 12 and an output shaft angle detection section 86 that detects the rotation speed and rotation angle of the output shaft 16. Moreover, a capacitor 88, which serves as a circuit board attached component, is attached (mounted) to the surface of the motor drive controller 84 at a gear housing body 58 side. The capacitor 88 attached to the motor drive controller 84, and the output shaft side gear 40 are disposed so as to overlap with each other as viewed along the axial direction of the motor 12. Moreover, in the present exemplary embodiment, narrowing a portion of the gear housing chamber 56 of the above exemplary embodiment gives a configuration in which the capacitor 88 is disposed at the outside of the gear housing chamber 56 and alongside the side of one of the intermediate gear configuration bodies 46 (at the radial direction outside of one of the intermediate gear configuration bodies 46).

In the present modified example explained above, the capacitor 88 and the output shaft side gear 40 attached to the circuit board 80 are disposed so as to overlap as viewed along the axial direction, thereby suppressing the capacitor 88 from protruding toward the radial direction outside of the actuator 82 with respect to the circuit board 80. This enables the size of the actuator 82 to be suppressed from increasing in the radial direction.

Note that in the present modified example, explanation has been given regarding an example in which the capacitor 88 attached to the circuit board 80 and the output shaft side gear 40 are disposed so as to overlap with each other as viewed along the axial direction. However, the present invention is not limited thereto. For example, when a heat sink, transistor, or the like, attached to the circuit board 80 and the output shaft side gear 40 are disposed so as to overlap with each other as viewed along the axial direction, this also enables the actuator 82 to be suppressed from increasing in size in the radial direction.

Although explanation has been given regarding an exemplary embodiment of the present invention, the present invention is not limited to the above description, and obviously various modifications other than those described may be made within a scope not departing from the spirit of the present invention.

What is claimed is:
1. An actuator comprising:
a motor including a rotation shaft;
an output shaft disposed coaxially to the rotation shaft;
a rotation shaft side gear provided so as to be rotatable as a unit with the rotation shaft;
an output shaft side gear provided so as to be rotatable as a unit with the output shaft;
an intermediate gear configuration body that meshes with the rotation shaft side gear and the output shaft side gear and that is provided between the rotation shaft side gear and the output shaft side gear, wherein the intermediate gear configuration body includes a first intermediate gear, and a second intermediate gear provided so as to be rotatable as a unit with the first intermediate gear and disposed further to a radial direction outside of the motor than the first intermediate gear;
a first bearing that supports an end portion of the intermediate gear configuration body at a side of the first intermediate gear; and
a second bearing that supports another end portion of the intermediate gear configuration body at a side of the second intermediate gear, wherein an outer diameter of the second bearing is larger than an outer diameter of the first bearing.

2. The actuator of claim 1, wherein, in cross-section taken along axial directions of the rotation shaft and the output shaft, an end of the first intermediate gear at a side of the output shaft is disposed further to the output shaft side than an end of the output shaft side gear at a side of the motor.

3. The actuator of claim 1, wherein angles of the rotation shaft side gear, the first intermediate gear, the second intermediate gear, and the output shaft side gear are set such that a direction of a thrust force produced by the rotation shaft side gear meshing with the first intermediate gear is a direction opposite to a direction of a thrust force produced by the second intermediate gear meshing with the output shaft side gear.

4. The actuator of claim 1, wherein:
the motor is configured including a stator, and a rotor disposed at the radial direction inside of the stator; and
a dimension of the stator in the rotation shaft axial direction is set shorter than a dimension of the stator in a motor radial direction.

5. The actuator of claim 1, wherein a rotation axis direction of the intermediate gear configuration body is disposed orthogonal to a rotation axis direction of the rotation shaft.

6. The actuator of claim 1 further comprising a detected portion that is provided at an end portion of the intermediate gear configuration body for detecting a rotation speed of the intermediate gear configuration body.

7. The actuator of claim 6, wherein the detected portion is attached to an end portion of the intermediate gear configuration body at the second intermediate gear side, in a state so as to be disposed at a side opposite to the side of the first bearing with the second bearing interposed therebetween.

8. The actuator of claim 6, further comprising a gear housing, wherein a detecting portion that detects the detected portion is disposed at an outside of the gear housing.

9. The actuator of claim 8, wherein:
a circuit board, mounted with the detecting portion, is provided at one side in an axial direction of the intermediate gear configuration body; and
a component attached to the circuit board and the output shaft side gear are disposed so as to overlap with each other as viewed along the axial direction of the output shaft.

10. The actuator of claim 1 further comprising a gear housing, wherein:
the rotation shaft side gear, the output shaft side gear, and the intermediate gear configuration body are housed inside the gear housing; and
a restriction portion that restricts movement of the intermediate gear configuration body toward the first intermediate gear side with respect to the gear housing is provided at at least one of the gear housing, the second bearing, or the intermediate gear configuration body.

11. The actuator of claim 10, wherein the restriction portion is provided at the second bearing.

12. The actuator of claim 11, wherein:
the restriction portion is disposed between the gear housing and a retaining member that is attached to the gear housing.

* * * * *